United States Patent [19]
Hallberg et al.

[11] Patent Number: 5,959,442
[45] Date of Patent: Sep. 28, 1999

[54] BUCK CONVERTER

[75] Inventors: Alan Hallberg, Aloha; Don J. Nguyen, Portland, both of Oreg.

[73] Assignee: Intel Corporation, Santa Clara, Calif.

[21] Appl. No.: 08/941,665

[22] Filed: Sep. 30, 1997

[51] Int. Cl.$^6$ ............................................. G05F 1/56
[52] U.S. Cl. ............................................................ 323/282
[58] Field of Search ................................. 323/223, 224, 323/226, 266, 270, 271, 273, 282

[56] References Cited

U.S. PATENT DOCUMENTS

| | | | |
|---|---|---|---|
| 4,816,739 | 3/1989 | Sakurai et al. | 323/272 |
| 5,304,875 | 4/1994 | Smith | 327/109 |
| 5,408,150 | 4/1995 | Wilcox | 327/108 |
| 5,410,467 | 4/1995 | Smith et al. | 363/131 |
| 5,481,178 | 1/1996 | Wilcox et al. | 323/287 |
| 5,610,503 | 3/1997 | Fogg et al. | 323/283 |
| 5,610,504 | 3/1997 | Tsugita | 323/283 |
| 5,625,280 | 4/1997 | Voldman | 323/284 |
| 5,627,460 | 5/1997 | Bazinet et al. | 323/288 |
| 5,808,459 | 9/1998 | Yazdy | 323/314 |

*Primary Examiner*—Matthew Nguyen
*Attorney, Agent, or Firm*—Blakely, Sokoloff, Taylor & Zafman

[57] ABSTRACT

A voltage converter for converting an input voltage to a different output voltage includes an output filter for providing the output voltage and a voltage switch coupled in series between the input voltage and the output filter. A controller compares the output voltage to a reference voltage and in response thereto, provides signals to turn the voltage switch on or off. A level shifter is coupled between the controller and the voltage switch.

20 Claims, 3 Drawing Sheets

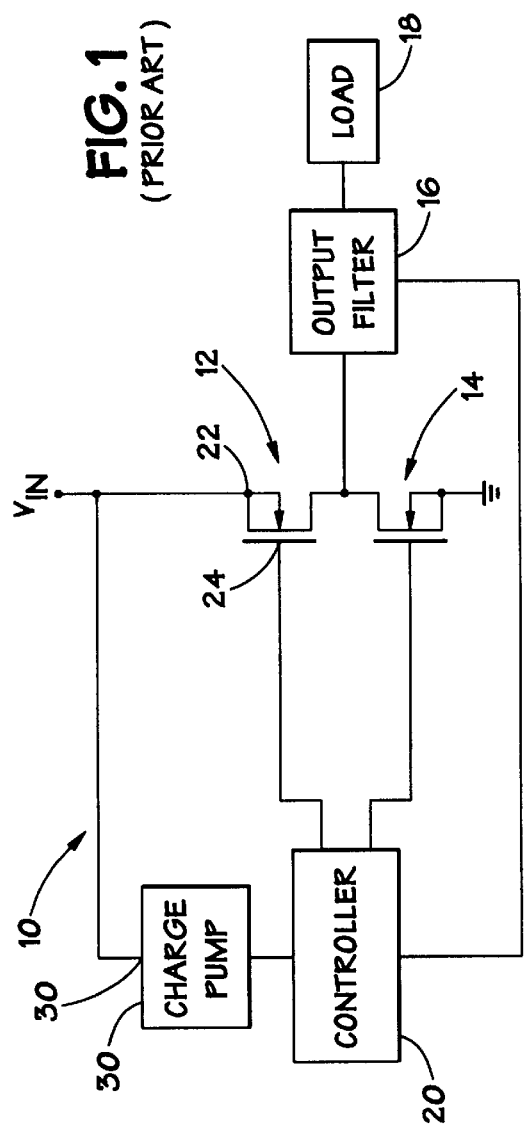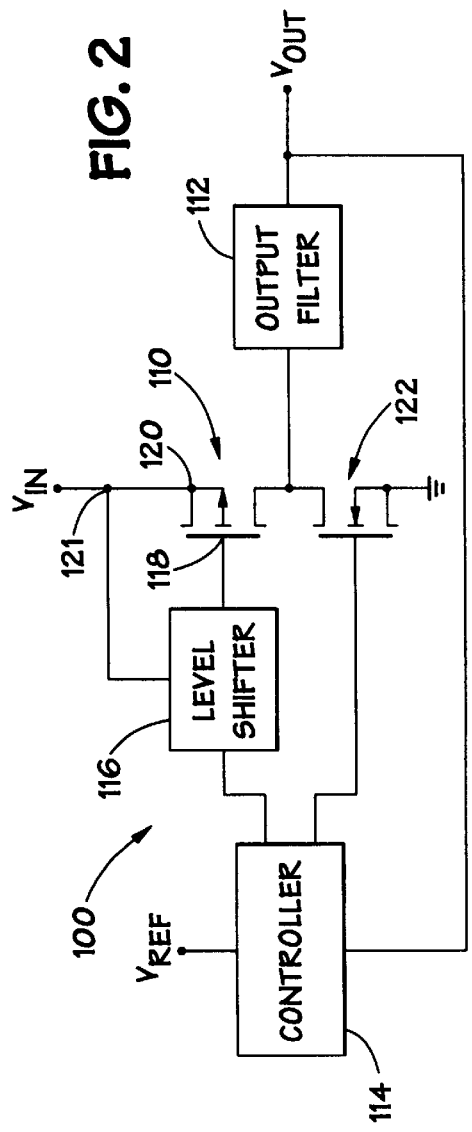

BUCK CONVERTER

BACKGROUND OF THE INVENTION

1. Field of the Invention

The invention relates generally to voltage converters and, more specifically, to a high-efficiency, wide input voltage range buck converter.

2. Description of Related Art

Generally, a voltage regulator converts an input voltage to a different output voltage. An example of a typical application is a battery powered electronic device such as a portable computer. In an example such as this, a voltage regulator is required to provide a predetermined and constant output voltage to a load from an often fluctuating input voltage source, the battery.

A buck converter converts the input voltage to a lower output voltage, and a synchronous buck converter includes a pair of switches coupled in series across the input voltage source. One switch, the voltage switch, is coupled to the voltage source and the other switch is connected to ground. An output filter typically including an inductor and a capacitor is connected to a junction formed by the pair of switches for providing the output voltage to a load. A controller drives the switches to connect the output filter to the voltage supply or to ground to maintain the output voltage at a predetermined level.

In many voltage regulator circuits, an N-channel metal oxide semiconductor field effect transistor (MOSFET) is used for the voltage switch to supply current to the output filter and in turn, to the load. An N-channel MOSFET is used rather than a P-Channel MOSFET because the N-channel MOSFET has a lower drain-source resistance when it is an "on" condition (Rds__ON). However, it is generally more difficult to drive an N-Channel MOSFET to a low Rds__ON condition. To have a low Rds__ON condition in an N-Channel MOSFET, its gate must be driven higher than its drain. This requires a separate "step-up" voltage that is about 5 volts higher than the input voltage to ensure that the gate of the N-Channel MOSFET is driven above its drain.

FIG. 1 illustrates a simplified circuit diagram of a prior alt buck converter 10 having an N-channel MOSFET voltage switch 12. A lower switch 14 is coupled in series between the voltage switch 12 and ground. An output filter 16 provides output voltage to a load 18 under the operation of a controller 20. The output filter 16 is connected at a junction between the voltage switch 12 and the lower switch 14. The controller 20 drives the switches 12 and 14 to maintain the desired output voltage level. The input voltage Vin is coupled to a drain 22 of the N-channel MOSFET voltage switch 12. To turn the switch 12 completely on and insure a low Rds__ON, an additional element, such as a is charge pump 30 or boost converter, is coupled between the input voltage $V_{in}$ and the controller 20 to boost the signal provided from the controller to the gate 24 of the voltage switch 12. The charge pump 30 is necessary to drive the gate 24 of the switch 12 higher than the drain 22 sufficiently to fully turn on the switch 12. The charge pump 30 adds cost and complexity to the voltage converter 10, and increases power consumption, which is especially undesirable in a battery powered application.

Alternately, the gate of a P-Channel MOSFET, needs only to be driven at about 4.5 volts lower than its source to ensure a low Rds__ON condition. Unfortunately, existing voltage converters utilizing P-channel MOSFET voltage switches have been largely unsatisfactory. These circuits often function only with a limited input voltage range. Further, they tend to be inefficient, which is a fundamental concern with battery powered applications such as mobile computers or portable telephones.

Thus, a need exists for a voltage converter that addresses the shortcomings of the prior art.

SUMMARY OF THE INVENTION

In one aspect of the present invention, a voltage converter for converting an input voltage to a different output voltage is presented. It includes an output filter for providing the output voltage and a circuit that alternately couples the output filter to the input voltage and to ground in response to the difference between the reference voltage and the output voltage.

In an exemplary embodiment, the voltage converter includes a voltage switch coupled in series between the input voltage and the output filter. A controller compares the output voltage to a reference voltage and in response thereto, provides signals to turn the voltage switch on or off. A level shifter is coupled between the controller and the voltage switch. In another embodiment, the level shifter includes a circuit which controls the voltage switch gate to source voltage such that when the controller provides the signal to turn the voltage switch on, the gate to source voltage differential is sufficient to fully turn the voltage switch on while not exceeding a maximum level.

In another aspect of the present invention, a level shifter for driving a voltage switch in a voltage converter which converts an input voltage to a different output voltage is presented. The voltage switch is coupled to the input voltage and includes a gate. The level shifter has a level shift transistor coupled to the gate which controls the voltage at the gate so that the voltage switch fully turns on. The level shift transistor includes a driver terminal, and an apparatus is coupled between the input voltage and the driver terminal for limiting the voltage at the driver terminal.

In yet another aspect of the present invention, a method for driving a voltage switch in a voltage converter which converts an input voltage to a different output voltage is presented. The voltage switch includes a gate and a source with the source coupled to the input voltage. The method includes providing a level shift transistor coupled to the gate of the voltage switch. The level shift transistor has a gate coupled to a bootstrap capacitor. The method further includes charging the bootstrap capacitor such that it provides a negative voltage to the gate of the level shift transistor, thereby pulling the gate of the voltage switch to ground.

BRIEF DESCRIPTION OF THE DRAWINGS

Other objects and advantages of the invention will become apparent upon reading the following detailed description and upon reference to the drawings in which:

FIG. 1 is a simplified circuit diagram of a prior art synchronous buck converter using an N-channel MOSFET voltage switch;

FIG. 2 is a simplified block diagram of a buck converter in accordance with the present invention;

Figure 3:
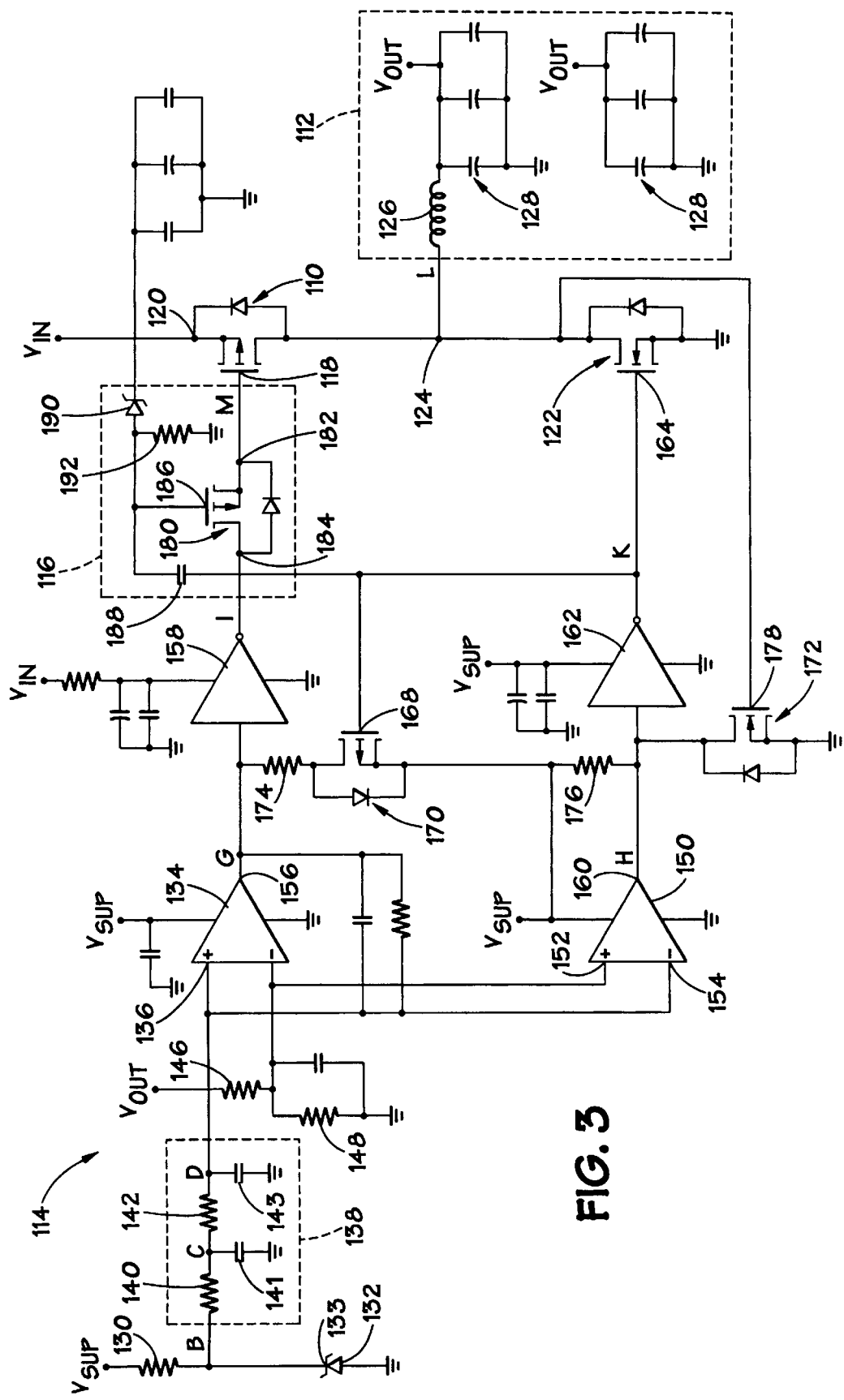
FIG. 3 is a schematic diagram of an exemplary embodiment of a synchronous buck converter in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning to the drawings and in particular, FIG. 2, a simplified block diagram of a synchronous buck converter 100 in accordance with an embodiment of the present invention is illustrated. The exemplary synchronous buck converter 100 includes a voltage switch 110 coupled in series between an input voltage $V_{in}$ and an output filter 112. The output filter 112 produces an output voltage $V_{out}$, which is delivered to a load and monitored by a controller 114. The controller 114 compares the output voltage $V_{out}$ to a predetermined reference voltage $V_{ref}$ and in response thereto, drives the voltage switch 110 and a lower switch 122. A level shifter 116 is coupled between the controller 114 and the voltage switch 110.

Basically, a buck converter converts the input voltage $V_{in}$ to a lower output voltage $V_{out}$. In a typical portable computer application, the input voltage $V_{in}$ is supplied by a battery and varies from about 4.75 volts to about 21 volts. The exemplary buck converter illustrated in FIG. 2 provides an output voltage $V_{out}$ of about 2.5 volts. The voltage switch 110 is connected in series with the output filter 112 and operates to connect and disconnect the input voltage $V_{in}$ to the output filter to generate the lower output voltage, $V_{out}$. The controller 114 compares the reference voltage $V_{ref}$ to the output voltage $V_{out}$ to control the voltage switch 110. If the output voltage $V_{out}$ falls below the reference voltage $V_{ref}$, the voltage switch 110 is turned on. If the output voltage $V_{out}$ rises above the reference voltage $V_{ref}$, the voltage switch 110 is turned off. The output filter 112 includes a storage device that is charged when the voltage switch 110 is on. When the voltage switch 110 is off, the storage device discharges allowing the output filter 112 to continue to provide the output voltage $V_{out}$.

The level shifter 116 of the present invention performs two primary functions. First, it improves the efficiency of the synchronous buck converter 100. Additionally, it protects the voltage switch 110 from voltage extremes, allowing a synchronous buck converter 100 in accordance with the present invention to operate at a wider input voltage range than known voltage converters. In an embodiment of the present invention, the switch 110 comprises a P-channel metal oxide semiconductor field-effect transistor (MOSFET). The maximum rated gate-source voltage $V_{gs}$ of a MOSFET such as may be used for the voltage switch 110 is about 20 volts; if the gate-source voltage $V_{gs}$ exceeds this level, the voltage switch 110 may be damaged. However, to fully switch "on" a P-channel MOSFET, its driver terminal, or gate 118 needs to be driven only about 4.5 volts lower than its source 120. In other words, the gate-source voltage $V_{gs}$ of the voltage switch 110 should be about –4.5 volts.

In the embodiment illustrated in FIG. 2, a source 120 of the voltage switch 110 is coupled to the input voltage $V_{in}$, and the gate terminal 118 is coupled to the level shifter 116. Thus, the gate 118 must be driven about 4.5 volts lower than the input voltage $V_{in}$ to turn the voltage switch 110 on and connect the input voltage $V_{in}$ to the output filter 112. Driving the gate 118 more than 4.5 volts below the input requires more charge to be injected into the discharged gate 118 to charge it back up to turn the voltage switch 110 off. This additional charge required to turn the voltage switch 110 off results in reduced efficiency, referred to as "transition loss."

Further, the source 120 of the voltage switch 110 is connected to the input voltage $V_{in}$, which may exceed 20 volts. A typical maximum rated $V_{gs}$ for a MOSFET such as that comprising the voltage switch 110 in an embodiment of the invention is 20 volts. If the voltage at the gate 118 $V_g$ is at or near ground potential when the input voltage $V_{in}$ is at or near the maximum level, the $V_{gs}$ of the voltage switch 110 will exceed the maximum rated $V_{gs}$ level. Operating the voltage switch 110 at or above the maximum $V_{gs}$ may shorten the life of the component, and in turn, the circuit. To reduce the possibility of this condition, the level shifter 116 functions to limit the $V_{gs}$ of the voltage switch 110 to a level below the maximum $V_{gs}$. In one embodiment, the level shifter 116 is constructed to limit the $V_{gs}$ to about 7 volts or less.

While a $V_{gs}$ greater than the maximum rated level of 20 volts is detrimental to the circuit, a $V_{gs}$ that is too low may also shorten the life of the synchronous buck converter 100. In one embodiment, the minimum input voltage $V_{in}$ is about 4.75 volts. Therefore, the gate 118 of the voltage switch 110 must be driven near ground potential to fully turn it on. If the gate 118 is less than 4.5 volts lower than the source 120, the voltage switch 110 will only be "partially" on. In other words, the drain-source resistance Rds_ON increases, resulting in increased power (heat) flowing through the voltage switch 110. This condition reduces efficiency and also may shorten the life of the voltage switch 110. To remedy this problem, the level shifter 116 of the present invention ensures that the gate 118 of the voltage switch 110 is pulled to ground potential when the input voltage $V_{in}$ falls near the minimum level.

FIG. 3 is an exemplary circuit diagram of the synchronous buck converter 100 constructed in accordance with an embodiment of the present invention. In FIG. 3, the voltage switch 110 comprises a P-channel MOSFET transistor. The voltage switch 110 is coupled to the input voltage $V_{in}$, and the lower switch 122 is coupled in series between the voltage switch 110 and ground. A junction 124 is formed between the voltage switch 110 and the lower switch 122, with the output filter 112 being coupled to the junction 124. The output filter 112 comprises a filter including a coil 126 coupled in series with a plurality of capacitors 128.

The controller 114 compares the output voltage $V_{out}$ to the predetermined reference voltage $V_{ref}$ and drives the voltage switch 110 and the lower switch 122 accordingly. A reference supply voltage $V_{sup}$ is coupled to one terminal of a shunt resistor 130. A bandgap reference 132 is connected in series between the other terminal of the shunt resistor 130 and ground, with its cathode 133 coupled to the shunt resistor 130, resulting in the predetermined reference voltage $V_{ref}$ at the cathode 133. In the exemplary embodiment illustrated in FIG. 3, an LM4041 zener diode is used for the bandgap reference 132. The reference voltage $V_{ref}$ is also coupled to a first comparator 134. The first comparator 134 has a first input 136 connected to the reference voltage $V_{ref}$ at the cathode 133 of the bandgap reference zener diode 132 through a time delay circuit 138. The time delay circuit 138 comprises two resistive-capacitive (RC) networks, each including a resistor 140 and 142 and a capacitor 141 and 143. The output voltage $V_{out}$ is supplied to a second input 144 of the first comparator 134 through a voltage divider consisting of series resistors 146 and 148.

A second comparator 150 has its first input 152 and its second input 154 coupled to the second input 144 and first input 136, respectively, of the first comparator 134. Both comparators 134, 150 are powered by the reference supply voltage $V_{sup}$. The output 156 of the first comparator 134 is inverted by an inverting driver 158 and input to the level shifter 116. The output 160 of the second comparator 150 is input to a non-inverting driver 162, and then output to a gate 164 of the lower switch 122, a gate 168 of a first safety transistor 170, and the level shifter 116. The first safety transistor 170 is coupled between the outputs 156, 160 of the first and second comparators 134, 150 through pull-up resistors 174 and 176. A gate 178 of a second safety transistor 172 is coupled to the junction 124 between the voltage switch 110 and the lower switch 122.

In an embodiment of the invention, an LM339 quad comparator provides the first comparator 134 and the second comparator 150. Further, a TC4431 inverting CMOS driver may be used for the driver 158 and a TC1413 non-inverting CMOS driver may be used for the driver 162.

The level shifter 116 includes a level shift transistor 180, which in the embodiment illustrated in FIG. 3 comprises a P-channel MOSFET. The level shift transistor 180 has its source 182 coupled to the gate 118 of the voltage switch 110, and its drain 184 coupled to the output of the driver 158. A gate 186 of the level shift transistor 180 is coupled to one terminal of a bootstrap capacitor 188, which has its other terminal coupled to the output of the driver 162. Additionally, the gate 186 is coupled to the input voltage $V_{in}$ through a zener diode 190, and to ground through a pull down resistor 192.

Figure 4:
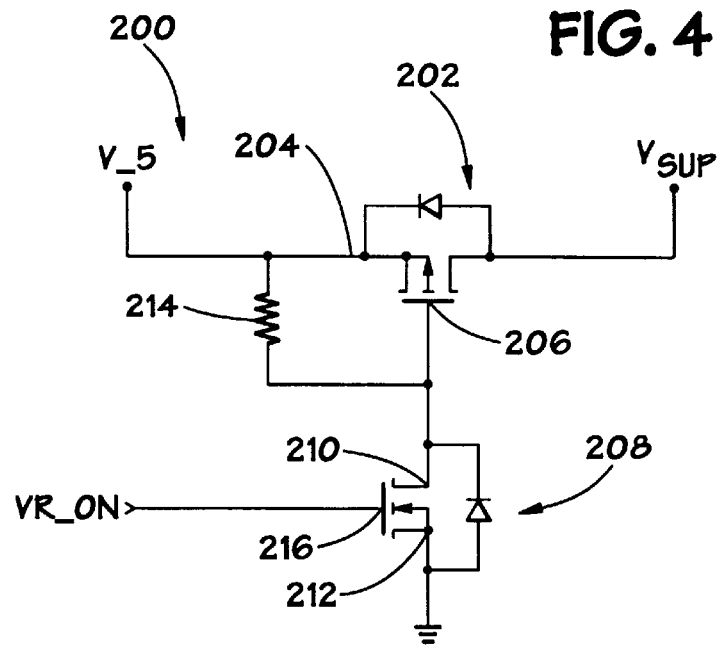
FIG. 4 is a schematic diagram of a reference voltage circuit for a synchronous buck converter in accordance with the present invention.

FIG. 4 illustrates a schematic diagram of a reference supply voltage circuit 200 that may be used to generate the reference supply voltage $V_{sup}$ for the synchronous buck converter 100 of the present invention. In one embodiment, a 5 volt supply V_5 is coupled to a source 204 of a first transistor 202. A resistor 214 is coupled in series between the 5 volt source V_5 and a gate 206 of the first transistor 202. The gate 206 of the first transistor 202 is also coupled to a drain 210 of a second transistor 208, which has its source 212 coupled to ground. A turn-on voltage VR_ON is coupled to a gate 216 of the second transistor 208, which, when applied, turns on the circuit to generate the reference supply voltage $V_{sup}$.

The operation of the embodiment of the invention illustrated in FIGS. 3 and 4 is best described with an example. The following example is illustrative in nature; the voltage levels, time delays, etc. are not intended to be limiting.

Prior to the input voltage $V_{in}$ of about 4.75 volts to about 21.0 volts and the 5 volt supply V_5 voltages being applied, all voltage nodes in the circuit are essentially at zero potential. After Vin and V_5 are energized, at the assertion of VR_ON, the second transistor 208 of the reference voltage circuit 200 turns on, forcing the gate of the first transistor 202 to go to about ground (0 volts). This will turn on the first transistor 202 of the reference supply voltage circuit 200 and $V_{sup}$ will transition from 0 to 5 volts in a short amount of time. The bandgap reference 132 shunts the current through the shunt resistor 130 and clamps the reference voltage $V_{ref}$ at node B to about 1.225 volts. The voltage at node C will rise to the same level as node B in about 1 millisecond (ms) through the RC time delay of the resistor 140 and the capacitor 141. The reference voltage $V_{ref}$ developed at node C is will appear at node D after a second RC time delay induced by the resistor 142 and the capacitor 143.

The first comparator 134 will compare the reference voltage $V_{ref}$ at node D to node F, which comprises the output voltage $V_{out}$ divided down by series resistors 146 and 148. The voltage at node F is at ground potential initially (0 volts). Because node D is at a higher potential than node F, node G will not be pulled down by the first comparator 134. Further, node G is not pulled high because the first safety transistor 170 is off. The voltages at nodes D and F are also input to the second comparator 150, pulling node H at the output 160 low. After a small time delay, node K will follow node H and go low. This turns the lower switch 122 off and the first safety transistor 170 on, and sources current through the resistor 174 as a pull-up to cause node G to go high. The polarity of node I, which is the output of the inverting driver 158, is opposite to that of node G. Thus, node I will go low.

Since node I is low, node M will go low and turn on the voltage switch 110. When the voltage switch 110 is on, node L is connected to the input voltage $V_{in}$ (minus the small voltage drop across the voltage switch 110). Current will begin to flow through the coil 126. This current will charge the output capacitors 128, causing the output voltage $V_{out}$ to rise.

The voltage switch 110 will stay on until $V_{out}$ reaches a predetermined high voltage, which in this exemplary embodiment is about 2.5 volts. When $V_{out}$ reaches this level, the voltage at node F will be higher than the voltage at node D. This will force the output 156 of the first comparator 134, node G, low (0 volts), and node I, in turn, will go high ($V_{in}$). The high value at node I is passed through the intrinsic body diode of the level shift transistor 180 to node M, turning off the voltage switch 110. When the voltage switch 110 turns off, the coil 126 will try to maintain a continuous current flow, and will force node L low, to a voltage of −0.7 volts. This is the forward voltage of the intrinsic body diode of the lower switch 122.

Since the voltage at node F ($V_{out}$) is higher than node D ($V_{ref}$), the second comparator 150 no longer holds node H low. The second safety transistor 172 insures that the voltage switch 110 is off before the lower switch 122 turns on, preventing a short circuit. The second safety transistor 172 continues to hold node H low, thereby preventing the lower switch 122 from turning on until the voltage switch 110 is off and voltage at node L has decayed to about 1.5 volts or less. When the node L voltage has decayed to 1.5 volts or less, the second safety transistor 172 turns off, allowing resistor 176 to pull node H high. Node K has the same polarity as node H, and thus will also go high. When node K is high, the lower switch 122 will turn on, clamping node L to about ground potential (about 0 volts).

The second safety transistor 172 further functions to insure that the lower switch 122 turns off if the voltage switch 110 turns on. For example, assume that the voltage converter 100 is in the condition described above, wherein the voltage switch 110 is off and the lower switch 122 is on. If the voltage switch 110 fails, or another component of the circuit fails and causes the voltage switch to turn on, the second safety transistor 172 will turn on and force node H low. The low at node H will turn the lower switch 122 off and prevent a short circuit.

The lower switch 122 provides a current path for the coil 126 to collapse its magnetic fields and maintain the current flow to the output $V_{out}$. At this point, the coil 126 is the current source in the circuit, providing current to the output $V_{out}$ and through a load (not shown) connected thereto, returning through the lower switch 122. This current flow continues until the output voltage $V_{out}$ divided down by the resistors 146 and 148 at node F drops below the reference setting of node D. At that point, the first comparator 134 stops pulling node G low and the second comparator 150 pulls node H low. Node K follows node H low, turning the lower switch 122 off and the first safety transistor 170 on. Node G then goes high and nodes I and M, in turn, go low, turning on the voltage switch 110 and the cycle begins again. The first safety transistor 170 functions to insure that node K is low, and thus, the lower switch 122 is off before the voltage switch 110 turns on, preventing a short circuit.

In a manner similar to the second safety transistor 172, the first safety transistor 170 insures that the voltage switch 110 turns off if the lower switch 122 inadvertently turns on. If, for example, a component failure causes the lower switch to turn on when the voltage switch 110 is on, node L is pulled to ground and goes low. This turns off the second safety transistor 172, causing node H and, in turn, node K to go high. The first safety transistor 170 then will turn off, causing node G to go low. Nodes I and M will then go high, turning off the voltage switch 110 to prevent a short circuit.

As discussed above, the level shifter 116 protects the voltage switch 110 by limiting its gate-source voltage $V_{gs}$. Therefore, the circuit can handle a wider range of input voltages $V_{in}$ than known voltage converters. By limiting the $V_{gs}$, efficiency is also improved by reducing transition losses that would occur if the gate 118 of the voltage switch 110 were allowed to go significantly more than 4.5 volts below its source 120. For the entire input voltage range of 4.5–21 volts in one embodiment of the invention, the gate to source voltage $V_{gs}$ of the voltage switch 110 never exceeds −7 volts. For all input voltage $V_{in}$ levels, node J will stabilize at $V_{in}$ minus the zener voltage of the zener diode 190, which is 9.1 volts in an exemplary embodiment.

To further illustrate the function of the level shifter 116, the circuit operation is discussed for two ranges of input voltages $V_{in}$.

$V_{in}$ greater than 9.1 volts

When the voltage at the drain 184 of the level shift transistor 180 (node I) goes to ground, the voltage at its source 182 (node M) will only go down to the level of the gate 186 voltage plus about 2 volts, since the gate to source threshold voltage $V_{gs(th)}$ of the level shift transistor 180 is about 2 volts. This is an inherent characteristic of the level shift transistor 180 as configured in the level shifter 116. This is due to the fact that as node M (the source 182) decays to within 2 volts of node J (the gate 186), the level shift transistor 180 turns off and the node M is no longer connected to node I. Hence, if node I goes low, node M will go to the level of node J plus about 2 volts. In the exemplary embodiment illustrated in FIG. 3, the zener diode 190 is a 9.1 volt zener diode. The input voltage $V_{in}$ is coupled to the source 120 of the voltage switch 110, so $V_{in}$ is the source voltage $V_s$ of the voltage switch 110. The gate voltage $V_g$ of the voltage switch is the voltage at node M. Therefore, the maximum gate-source voltage $V_{gs}$ of the voltage switch 110 is derived as follows:

$J = V_{in} - 9.1$ volts $M = V_{in} - 9.1 + 2 = V_{in} - 7.1$ $M = V_g$; $V_{in} = V_s$ $V_g = V_s - 7.1$ $V_g - V_s = -7.1$ $V_{gs} = -7.1$.

Thus, the gate-source voltage $V_{gs}$ of the voltage switch 110 does not exceed −7.1V.

$V_{in}$ less than 9.1 volts:

This input voltage $V_{in}$ range demonstrates the operation of the bootstrap capacitor 188, which drives node J negative, in turn driving node M to ground. This ensures that the voltage switch maintains an adequate $V_{gs}$ to fully turn on at low input voltage $V_{in}$ levels. At an input voltage $V_{in}$ below 9.1 volts (the zener voltage), the node J voltage begins to go negative ($J = V_{in} - 9.1$). Since the node M voltage is about 2 volts higher than the node J voltage, node M first goes to ground potential when the input voltage $V_{in}$ is 7 volts. Without the bootstrapping capacitor 188, if the input voltage $V_{in}$ falls below about 6.5 volts, the largest possible gate to source voltage $V_{gs}$ of the voltage switch 110 is less than −4.5 volts, and the voltage switch 110 does not fully turn on.

Consider an input voltage $V_{in}$ of 5.0 volts without bootstrapping:

$V_{in} = 5.0$ $J = 0$ volts $M = J + 2 = 2$ volts $M = V_g$; $V_{in} = V_s$ $V_g - V_s = 2 - 5.0 = -3.0$ volts $V_{gs} = -3.0$ volts In this case, the voltage switch 110 is not fully turned on, which increases the drain-source resistance. This decreases efficiency and could have the effect of shortening the life of the voltage switch 110.

The bootstrap capacitor 188 functions to remedy this problem. To illustrate the function of the bootstrap capacitor 188, consider the situation described above (input voltage $V_{in} = 5$ volts) with bootstrapping. The gate 186 of the level shift transistor 180 is pulled negative by the bootstrap capacitor 188. During the periods when the voltage switch 110 is off, node K is high at 5 volts, which charges the bootstrap capacitor 188 to 5 volts. When node K goes low, the bootstrap capacitor 188 forces the voltage at node J to −5 volts momentarily, then node J stabilizes at −4.1 volts ($V_{in} - 9.1$ volts). Node M, which by definition, is 2 volts higher than node J, now can go all the way to ground. (Note that even though node J is negative, the gate 118 of the voltage switch 110 will not go negative since it can only go as low as the voltage at node I). The negative voltage at node J insures that node M is at ground potential and the gate 118 of the voltage switch 110 is more than 4.5 volts lower than its source 120, thereby fully turning on the voltage switch 110.

Figure 5:
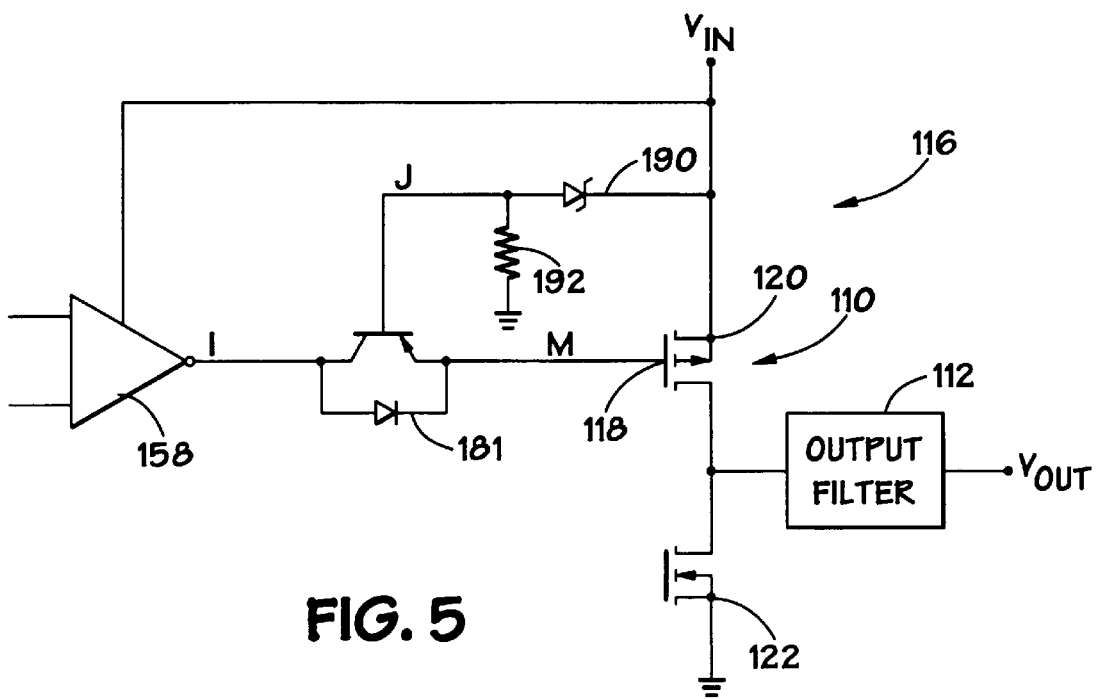
FIG. 5 is an illustration of an alternate embodiment of a level shifter circuit for a synchronous buck converter in accordance with the present invention.

An alternate embodiment of the level shifter 116 for the synchronous buck converter 100 constructed in accordance with the present invention is illustrated in FIG. 5. In this embodiment, the level shift transistor comprises an PNP bipolar transistor 181 rather than a P-channel MOSFET 180 as in the embodiment of FIG. 3. In this embodiment, the bootstrap capacitor 188 is not required, since the base-emitter voltage $V_{be}$ is only about 0.7 volts; therefore, the voltage at node M will be about 0.7 volts higher than the node J voltage. Thus, when the input voltage $V_{in}$ is greater than the zener voltage of 9.1 volts, the node M voltage will be $$M=V_{in}-9.1+0.7 \text{ volts}$$

$$M=V_{in}-8.4 \text{ volts}$$

For input voltage $V_{in}$ levels less than 9.1 volts, the voltage at node M will be 0.7 volts, since there is no current flowing through the resistor 192 to bias the zener diode 190. Thus, at low input voltage levels, the gate 118 of the voltage switch 110 is sufficiently lower than the source 120 to fully turn on the voltage switch 110.

The above description of exemplary embodiments of the invention are made by way of example and not for purposes of limitation. Many variations, may be made to the embodiments and methods disclosed herein without departing from the scope and spirit of the present invention. For example, alternate embodiments incorporating different PMOS/NMOS device combinations are envisioned. The present invention is intended to be limited only by the scope and spirit of the following claims.

What is claimed is:

1. A voltage converter for converting an input DC voltage to a different output DC voltage, comprising:

an output filter for providing the output voltage;

a voltage switch coupled in series between the input voltage and the output filter, the voltage switch including a gate and a source;

a controller which compares the output voltage to a reference voltage and in response thereto, outputs a control signal; and a level shifter for driving the voltage switch in response to the control signal and the input voltage, the level shifter operable to prevent the gate to source voltage of the voltage switch from exceeding a predetermined value.

2. The voltage converter of claim 1 wherein the voltage switch comprises a MOSFET.

3. The voltage converter of claim 1 wherein:

the level shifter further controls the gate to source voltage such that when the controller provides the signal to turn the voltage switch on, the gate to source voltage differential is sufficient to fully turn the voltage switch on.

4. The voltage converter of claim 1 wherein the level shifter comprises:

a level shift transistor coupled between the controller and the gate of the voltage switch, the level shift transistor including a driver terminal; and apparatus coupled between the input voltage and the driver terminal to limit the voltage at the driver terminal.

5. The voltage converter of claim 4 wherein the level shift transistor comprises a MOSFET, and the driver terminal is coupled to a bootstrap capacitor.

6. The voltage converter of claim 4 wherein the level shift transistor comprises a bipolar transistor.

7. A voltage converter for converting an input voltage to a different output voltage, comprising:

an output filter for providing the output voltage;

means for comparing the output voltage to a predetermined reference voltage;

a voltage switch coupled in series between the input voltage and the output filter, the voltage switch including a gate and a source;

means for driving the voltage switch responsive to the comparing means and the input voltage, such that the gate to source voltage differential is sufficient to fully turn the voltage switch on, and the gate to source voltage does not exceed a predetermined value.

8. The voltage converter of claim 7 further comprising a second switch coupled between the voltage switch and ground.

9. The voltage converter of claim 8 further comprising means for preventing the voltage switch and the second switch from simultaneously being on.

10. A voltage converter for converting an input voltage to a different output voltage comprising:

a P-channel MOSFET including a gate and a source, the source being responsive to the input voltage;

an N-channel MOSFET coupled in series between the P-channel MOSFET and ground, the P-channel MOSFET and the N-channel MOSFET forming a junction therebetween to provide an output;

a controller responsive to the output and to a reference voltage to generate signals for turning the P-channel MOSFET and the N-channel MOSFET on or off to generate the output voltage; and a level shifter coupled between the controller and the gate of the P-channel MOSFET for controlling the P-channel MOSFET gate to fully turn the P-channel MOSFET on.

11. The voltage converter of claim 10 wherein the level shifter further prevents the gate of the P-channel MOSFET gate to source voltage from exceeding a maximum voltage irrespective of the input voltage to a predetermined limit.

12. The voltage converter of claim 1 further comprising:

a second switch coupled between the voltage switch and ground; and first and second safety devices responsive to the voltage switch and the second switch, the first and second safety devices operable to prevent the voltage switch and the second switch from simultaneously being on.

13. The voltage converter of claim 4 wherein the apparatus comprises a zener diode having a cathode coupled to receive the input voltage and an anode coupled to the driver terminal.

14. A voltage converter for converting an input DC voltage to a different output DC voltage, comprising:

an output filter for providing the output voltage;

a P-channel MOSFET having a gate, a source and a drain, the source coupled to receive the input voltage and the drain coupled to the output filter;

a controller which compares the output voltage to a reference voltage and in response thereto, outputs a control signal; and a level shifter coupled to the gate, the level shifter operable to control the gate to source voltage in response to the control signal and the input voltage, such that the gate to source voltage differential is sufficient to fully turn the P-channel MOSFET on.

15. The voltage converter of claim 14 wherein the level shifter drives the gate to about ground potential in response to the input voltage falling below a predetermined level.

16. The voltage converter of claim 14 wherein the level shifter comprises:

a level shift transistor coupled between the controller and the gate of the P-channel MOSFET, the level shift transistor including a driver terminal; and a bootstrap capacitor coupled to the driver terminal.

17. The voltage converter of claim 14 wherein the level shifter comprises a bi-polar transistor.

18. The voltage converter of claim 14 wherein the level shifter is further operable to prevent the gate to source voltage from exceeding a predetermined value.

19. A voltage converter for converting an input DC voltage to a different output DC voltage, comprising:

an output filter for providing the output voltage;

first and second switches coupled in series between the input voltage and the output filter;

a controller which compares the output voltage to a reference voltage and in response thereto, outputs a control signal;

a level shifter for driving the voltage switch in response to the control signal and the input voltage; and first and second safety devices responsive to the first and second switches, the first and second safety devices operable to prevent the first and second switches from simultaneously being on.

20. The voltage converter of claim 19 wherein the first and second safety devices comprise first and second MOSFETs.

* * * * *